(12) United States Patent
Cho et al.

(10) Patent No.: US 12,022,712 B2
(45) Date of Patent: Jun. 25, 2024

(54) TRANSPARENT DISPLAY APPARATUS HAVING A PLURALITY OF DUMMY PATTERNS

(71) Applicant: LG Display Co., Ltd., Seoul (KR)

(72) Inventors: Namwook Cho, Paju-si (KR); ChangSoo Kim, Paju-si (KR); KiSeob Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 439 days.

(21) Appl. No.: 16/912,625

(22) Filed: Jun. 25, 2020

(65) Prior Publication Data

US 2021/0005680 A1 Jan. 7, 2021

(30) Foreign Application Priority Data

Jul. 5, 2019 (KR) .................. 10-2019-0081166

(51) Int. Cl.
*H10K 59/35* (2023.01)
*H10K 50/86* (2023.01)
*H10K 59/131* (2023.01)
*H10K 59/38* (2023.01)
*H10K 59/88* (2023.01)

(52) U.S. Cl.
CPC ......... *H10K 59/353* (2023.02); *H10K 50/865* (2023.02); *H10K 59/131* (2023.02); *H10K 59/38* (2023.02); *H10K 59/88* (2023.02)

(58) Field of Classification Search
CPC ............. H01L 27/3218; H01L 27/322; H01L 27/3223; H01L 27/3276; H01L 51/5284; H01L 51/524; H01L 27/326; H01L 51/5275; H01L 27/32; H01L 51/52; H10K 59/353; H10K 50/865; H10K 59/131; H10K 59/38; H10K 59/88; H10K 50/841; H10K 59/121; H10K 50/858; H10K 59/00; H10K 50/80
USPC ........................................................ 257/40
See application file for complete search history.

(56) References Cited

U.S. PATENT DOCUMENTS

| | | |
|---|---|---|
| 8,911,097 B2 | 12/2014 | Sung et al. |
| 10,134,816 B2 | 11/2018 | Kim |
| 10,270,064 B2 | 4/2019 | Kim |
| 10,429,689 B2 | 10/2019 | Yasumoto |
| 10,679,567 B2 | 6/2020 | Lee et al. |
| 11,489,029 B2 | 11/2022 | Song et al. |

(Continued)

FOREIGN PATENT DOCUMENTS

| | | |
|---|---|---|
| CN | 102087436 A | 6/2011 |
| CN | 103150964 A | 6/2013 |

(Continued)

*Primary Examiner* — Duy T Nguyen
(74) *Attorney, Agent, or Firm* — Seed IP Law Group LLP

(57) ABSTRACT

A transparent display apparatus for preventing the occurrence of a sense of difference between a display panel and a cover substrate is provided. The transparent display apparatus includes a transparent display panel including a first substrate, a second substrate, and a plurality of pixels provided between the first substrate and the second substrate, a display area including the plurality of pixels, and a non-display area surrounding the display area and a cover substrate including a first area overlapping the transparent display panel and a second area surrounding the first area and including a plurality of dummy patterns.

22 Claims, 10 Drawing Sheets

(56) References Cited

U.S. PATENT DOCUMENTS

| | | | | |
|---|---|---|---|---|
| 2009/0160817 A1* | 6/2009 | Wu | ............... | G06F 3/0445 |
| | | | | 345/173 |
| 2009/0257010 A1* | 10/2009 | Sakurai | ............ | G02F 1/133308 |
| | | | | 349/110 |
| 2011/0134378 A1* | 6/2011 | Tsuboi | ................. | H04N 5/65 |
| | | | | 349/110 |
| 2016/0195965 A1* | 7/2016 | Kim | ................. | G09G 5/003 |
| | | | | 345/173 |
| 2018/0068621 A1* | 3/2018 | Lee | ................. | H01L 51/56 |

FOREIGN PATENT DOCUMENTS

| | | |
|---|---|---|
| CN | 104157669 * | 11/2014 |
| CN | 105280671 A | 1/2016 |
| CN | 109728000 A | 5/2019 |
| JP | 2011-203317 A | 10/2011 |
| JP | 2012-069256 A | 4/2012 |
| JP | 2013-171128 A | 9/2013 |
| JP | 2013-178643 A | 9/2013 |
| JP | 2017-032887 A | 2/2017 |
| JP | 2018-159890 A | 10/2018 |
| KR | 10-2010-0112410 A | 10/2010 |
| KR | 10-2014-0106381 A | 9/2014 |
| KR | 10-2015-0079206 A | 7/2015 |
| KR | 10-2016-0119374 A | 10/2016 |
| KR | 10-2017-0015830 A | 2/2017 |
| KR | 20170045782 A | 4/2017 |
| KR | 20180006549 A | 1/2018 |
| KR | 10-2018-0069521 A | 6/2018 |

* cited by examiner

TRANSPARENT DISPLAY APPARATUS HAVING A PLURALITY OF DUMMY PATTERNS

CROSS-REFERENCE TO RELATED APPLICATIONS

This application claims the benefit of the Korean Patent Application No. 10-2019-0081166 filed on Jul. 5, 2019, which is hereby incorporated by reference as if fully set forth herein.

BACKGROUND

Technical Field

The present disclosure relates to a transparent display apparatus.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device have been widely utilized.

Moreover, transparent display devices which enable a user to look at a background or an object located behind the transparent display devices are being actively researched recently.

Transparent display apparatuses may include a display panel, which transmits external light so as to enable a user to see a thing or a background placed on a rear surface thereof, and a cover substrate attached on the display panel. In this case, since a light transmittance of the display panel differs from that of the cover substrate, the user may recognize a sense of difference between the display panel and the cover substrate.

BRIEF SUMMARY

Accordingly, the present disclosure is directed to providing a transparent display apparatus that substantially obviates one or more problems due to limitations and disadvantages of the related art.

An aspect of the present disclosure is directed to providing a transparent display apparatus for preventing the occurrence of a sense of difference between a display panel and a cover substrate.

Additional advantages and features of the disclosure will be set forth in part in the description which follows and in part will become apparent to those having ordinary skill in the art upon examination of the following or may be learned from practice of the disclosure. Other benefits of the disclosure may be realized and attained by the structure particularly pointed out in the written description and claims hereof as well as the appended drawings.

To achieve these and other advantages and in accordance with the purpose of the disclosure, as embodied and broadly described herein, there is provided a transparent display apparatus including a transparent display panel including a first substrate, a second substrate, and a plurality of pixels provided between the first substrate and the second substrate, the transparent display panel having a display area including the plurality of pixels, and a non-display area surrounding the display area and a cover substrate including a first area overlapping the transparent display panel and a second area surrounding the first area and including a plurality of dummy patterns.

In another aspect of the present disclosure, there is provided a transparent display apparatus including a transparent display panel including a first substrate, a second substrate, and a plurality of pixels provided between the first substrate and the second substrate, the transparent display panel having a display area including the plurality of pixels, and a non-display area surrounding the display area and a cover substrate including a third area overlapping the display area of the transparent display panel and a fourth area overlapping the non-display area of the transparent display panel, wherein a plurality of dummy patterns are provided in the fourth area of the cover substrate.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
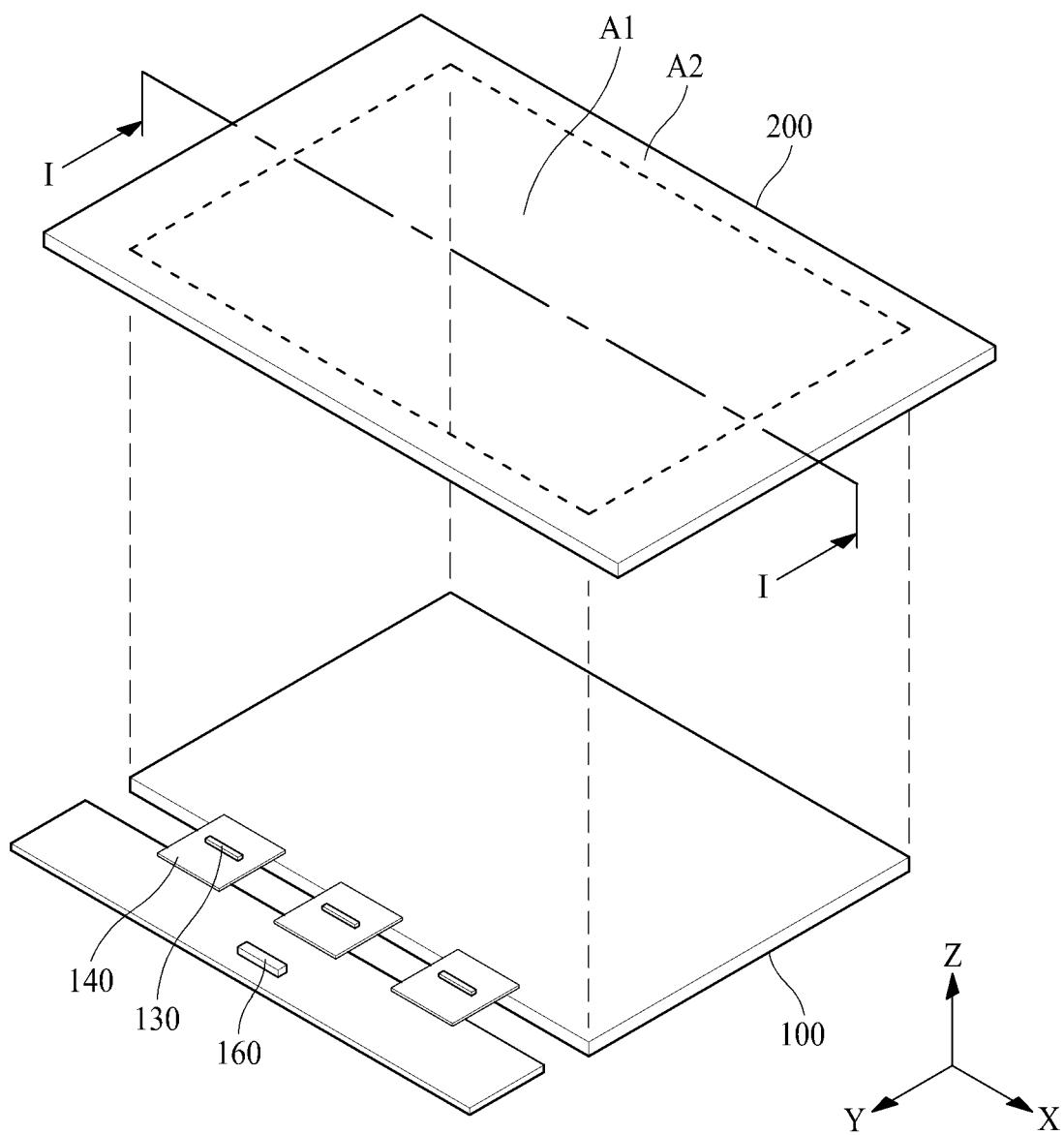
FIG. 1 is a perspective view illustrating a transparent display apparatus according to one or more embodiments of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise,' 'have,' and 'include' described in the present disclosure are used, another part may be added unless 'only~' is used. The terms of a singular form may include plural forms unless referred to the contrary.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a positional relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Terms such as first and second can be used to describe elements of the present disclosure. These terms are only used to distinguish one element from another element, and essentials, sequences, orders, or numbers of the elements are not limited by the terms. When an element is described as being "connected," "coupled," or "linked" to another element, it should be understood that the element may be connected or coupled directly to another element, still another element may be "interposed" between the elements, or the elements may be "connected," "coupled," or "linked" to each other via still another element.

"X-axis direction", "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or totally coupled to or combined with each other, and may be variously inter-operated and driven technically. The embodiments of the present disclosure may be carried out independently from each other or may be carried out together with a co-dependent relationship.

Reference will now be made in detail to the exemplary embodiments of the present disclosure, examples of which are illustrated in the accompanying drawings. Wherever possible, the same reference numbers will be used throughout the drawings to refer to the same or like parts.

Figure 2:
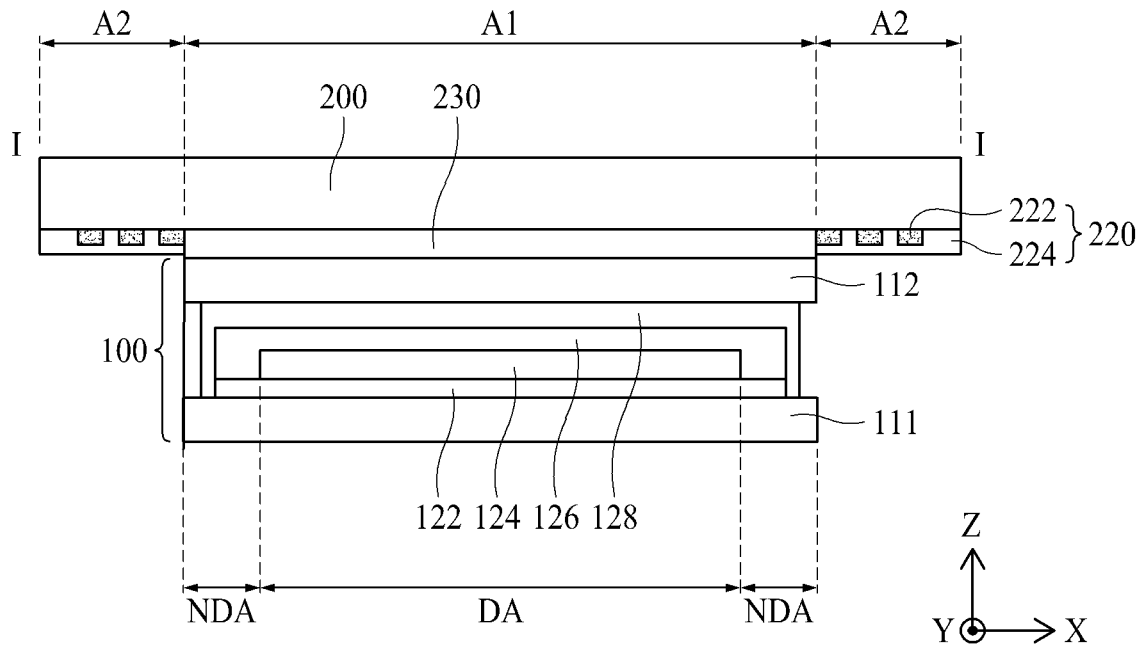
FIG. 2 is a cross-sectional view taken along line I-I of FIG. 1.

FIG. 1 is a perspective view illustrating a transparent display apparatus 10 according to one or more embodiments of the present disclosure, and FIG. 2 is a cross-sectional view taken along line I-I of FIG. 1.

Hereinafter, the transparent display apparatus according to one or more embodiments of the present disclosure will be described in detail with reference to FIGS. 1 and 2. In FIGS. 1 and 2, an X axis represents a direction parallel to a gate line, a Y axis represents a direction parallel to a data line, and a Z axis represents a height direction of the transparent display apparatus.

An example where the transparent display apparatus 10 according to one or more embodiments of the present disclosure is implemented as an organic light emitting display apparatus will be mainly described, but the transparent display apparatus 10 may be implemented as a liquid crystal display (LCD) apparatus, a plasma display panel (PDP), a quantum dot light emitting display (OLED) apparatus, or an electrophoresis display apparatus.

Referring to FIGS. 1 and 2, the transparent display apparatus 10 according to one or more embodiments of the present disclosure may include a transparent display panel 100 and a cover substrate 200.

The transparent display panel 100 according to one or more embodiments of the present disclosure may include a first substrate 111, a second substrate 112, a circuit device layer 122 disposed between the first and second substrates 111 and 112, a light emitting device layer 124, an encapsulation layer 126, and a first adhesive layer 128.

The transparent display panel 100 may include the first substrate 111 and the second substrate 112 facing each other. The second substrate 112 may be an encapsulation substrate. The first substrate 111 may be a plastic film, a glass substrate, or a silicon wafer substrate formed through a semiconductor process. The second substrate 112 may be a plastic film, a glass substrate, or an encapsulation film. The first substrate 111 and the second substrate 112 may include a transparent material.

The circuit device layer 122 may be provided over one surface of the first substrate 111 facing the second substrate 112. A circuit device including various signal lines, a thin film transistor (TFT), and a capacitor may be included in each pixel in the circuit device layer 122. The signal lines may include a gate line, a data line, a driving power line, a common power line, and a reference line. The TFT may include a switching TFT, a driving TFT, and a sensing TFT.

The switching TFT may be turned on based on a gate signal supplied through the gate line and may provide a data voltage, supplied through the data line, to the driving TFT.

The driving TFT may be turned on based on the data voltage transferred from the switching TFT and may generate a data current from power supplied through the driving power line to supply the data current to a first electrode of a pixel.

The sensing TFT may sense a threshold voltage deviation of the driving TFT which causes the degradation in image quality and may provide a current of the driving TFT to the reference line in response to a sensing control signal through the gate line or a separate sensing line.

The capacitor may hold the data voltage provided to the driving TFT during one frame and may be connected to each of a gate terminal and a source terminal of the driving TFT.

The light emitting device layer 124 may be provided over the circuit device layer 122. The light emitting device layer 124 may include a plurality of light emitting devices. Each of the plurality of light emitting devices may include a plurality of first electrodes, a light emitting layer, and a second electrode. The light emitting layer may include an organic light emitting layer including an organic material. In this case, the light emitting layer may include a hole transporting layer, an organic light emitting layer, and an electron transporting layer. In this case, when a voltage is applied to the first electrode and the second electrode, a hole and an electron may respectively move to the organic light emitting layer through the hole transporting layer and the electron transporting layer and may be combined in the organic light emitting layer to emit light. The light emitting device layer 124 may be a pixel array layer with a plurality of pixels provided therein, and thus, an area where the light emitting device layer 124 is provided may be defined as a display area. A peripheral area of the display area may be defined as a non-display area.

The encapsulation layer 126 may be provided over the light emitting device layer 124. The encapsulation layer 126 may prevent penetration of oxygen or water into the light emitting device layer 124. The encapsulation layer 126 may include at least one inorganic layer and at least one organic layer.

A first adhesive layer 128 may be provided over the encapsulation layer 126. The first adhesive layer 128 may attach the second substrate 112 over the first substrate 111 over which the circuit device layer 122, the light emitting device layer 124, and the encapsulation layer 126 are provided. The first adhesive layer 128 may be an optically clear resin layer (OCR) or an optically clear adhesive film (OCA).

Hereinafter, the transparent display panel 100 will be described in more detail with reference to FIGS. 3 to 5.

Figure 3:
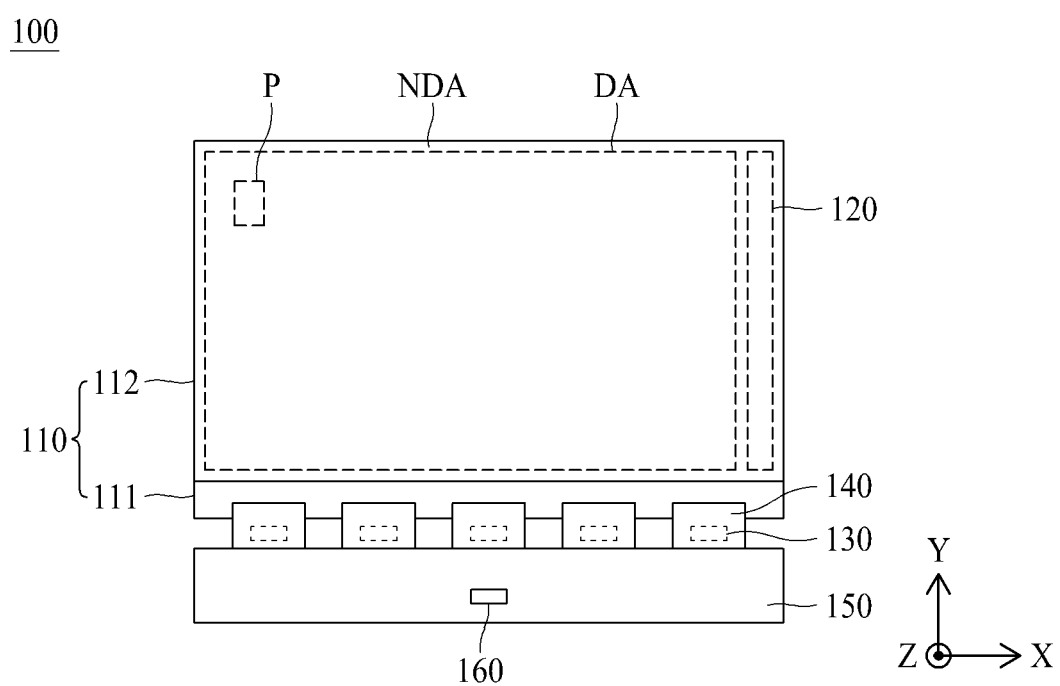
FIG. 3 is a plan view illustrating an example of the transparent display panel illustrated in FIG. 1.
Figure 4:
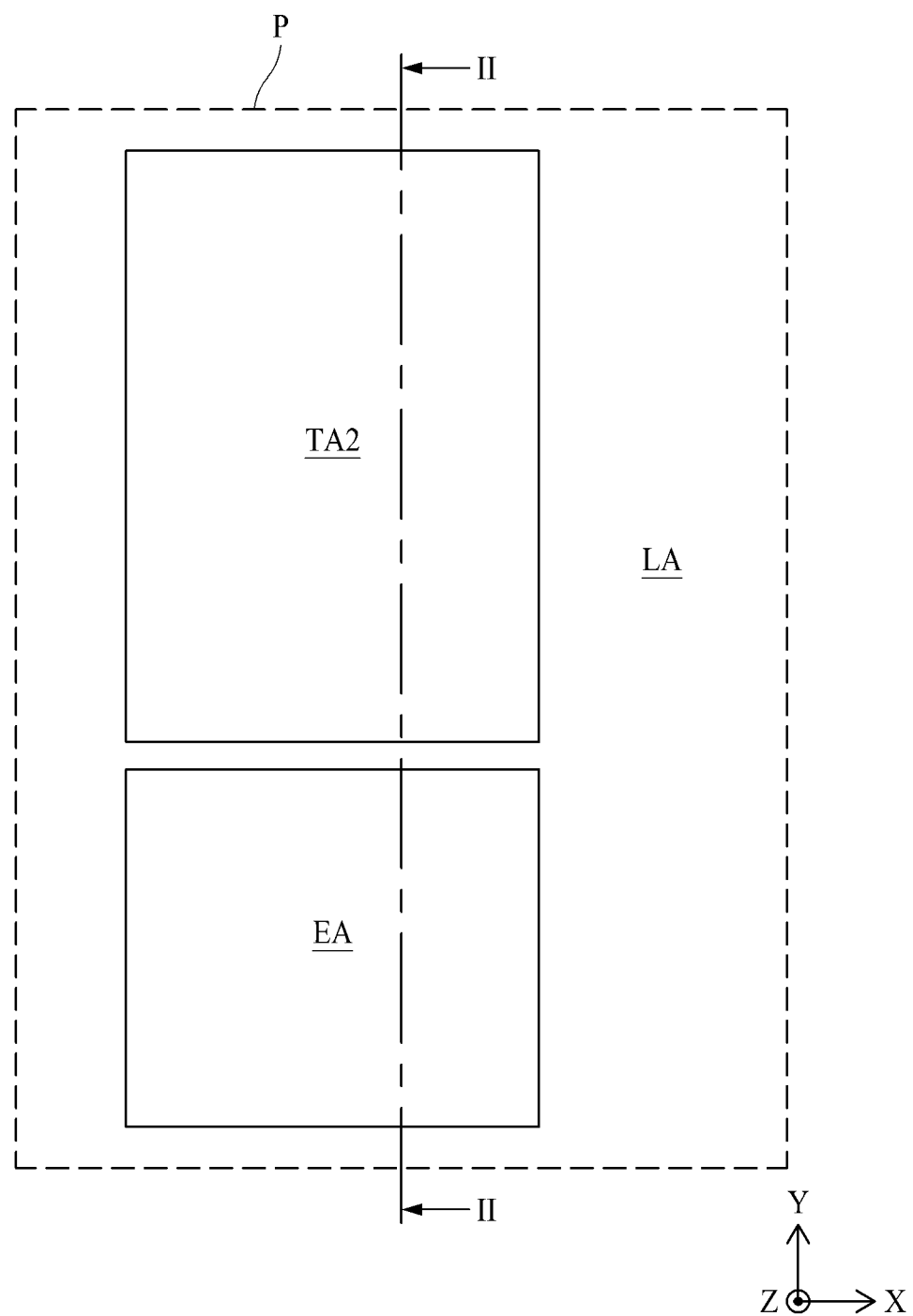
FIG. 4 is a plan view illustrating a pixel of FIG. 3.
Figure 5:
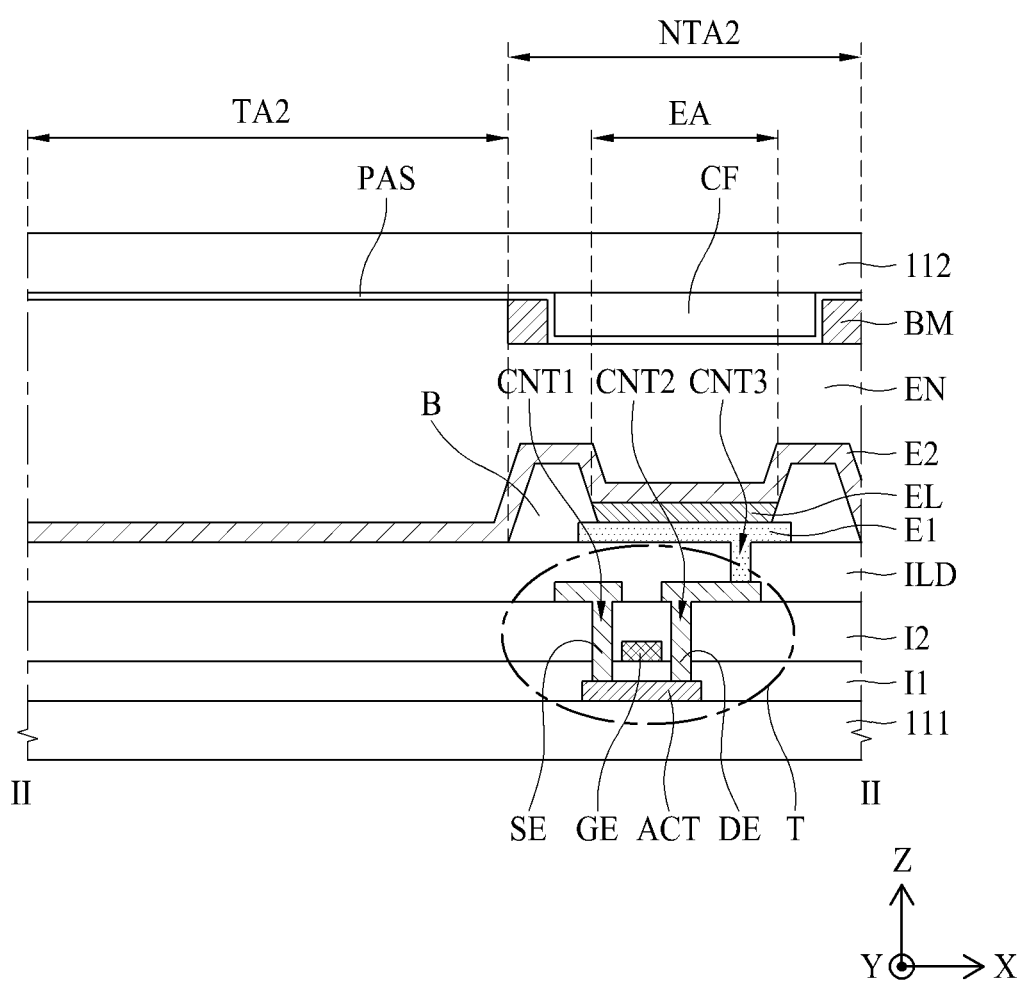
FIG. 5 is a cross-sectional view taken along line II-II of FIG. 4.

FIG. 3 is a plan view illustrating an example of the transparent display panel illustrated in FIG. 1, FIG. 4 is a plan view illustrating a pixel of FIG. 3, and FIG. 5 is a cross-sectional view taken along line II-II of FIG. 4.

Referring to FIGS. 3 to 5, the transparent display panel 100 may include a display substrate 110, a gate driver 120, a source drive integrated circuit (IC) 130, a flexible film 140, a circuit board 150, and a timing controller 160.

The display substrate 110 may include the first substrate 111 and the second substrate 112 facing each other. The second substrate 112 may be an encapsulation substrate. The first substrate 111 may be provided to be greater than the second substrate 112, and thus, a portion of the first substrate 111 may be exposed without being overlaid by the second substrate 112.

The transparent display panel 100 may transmit light incident thereon, or may display an image. A plurality of pixels P for displaying an image may be provided in a display area DA of the transparent display panel 100.

Each of the plurality of pixels P may include a transmissive area TA2 and a non-transmissive area NTA2 as in FIGS. 4 and 5. The non-transmissive area NTA2 may include an emission area EA and a line area LA. Each pixel P may enable a user to see a thing or a background placed over a rear surface of the transparent display panel 100 through the transmissive area TA2 and may display an image by using the emission area EA. In FIG. 4, the transmissive area TA2 and the emission area EA are illustrated as being provided to be long in a data line direction (e.g., a Y-axis direction), but are not limited thereto. That is, the transmissive area TA2 and the emission area EA may be provided to be long in a gate line direction (e.g., an X-axis direction).

The transmissive area TA2 may be an area which almost transmits light incident thereon, and the non-transmissive area NTA2 may be an area which hardly transmit light incident thereon. The emission area EA of the non-transmissive area NTA2 may be an area emitting light. The emission area EA may include at least one of a plurality of light emitting parts. For example, the plurality of light emitting parts may include a red light emitting part, a green light emitting part, and a blue light emitting part and may further include a white light emitting part. For another example, the plurality of light emitting parts may include at least two of a red light emitting part, a green light emitting part, a blue light emitting part, a yellow light emitting part, a magenta light emitting part, and a cyan light emitting part, and may further include a white light emitting part. The red light emitting part is an area emitting red light, the green light emitting part is an area emitting green light, and the blue light emitting part is an area emitting blue light. The red light emitting part, the green light emitting part, and the blue light emitting part of the emission area EA may each correspond to a non-transmissive area which emits certain light and does not transmit light incident thereon.

Each of the plurality of light emitting parts, as in FIG. 5, may include a light emitting device including a transistor T, a first electrode E1, a light emitting layer EL, and a second electrode E2.

The transistor T may include an active layer ACT provided over the first substrate 111, a first insulation layer I1 provided over the active layer ACT, a gate electrode GE provided over the first insulation layer I1, a second insulation layer I2 provided over the gate electrode GE, and a source electrode SE and a drain electrode DE which are provided over the second insulation I2 and connected to the active layer ACT through first and second contact holes CNT1 and CNT2. In FIG. 5, the transistor T is illustrated as being implemented as a top gate type, but is not limited thereto. According to other embodiments, the transistor T may be implemented as a bottom gate type where the gate electrode GE is disposed under the active layer ACT.

The first electrode E1 may be provided over an interlayer insulation layer ILD. The first electrode E1 may be connected to the source electrode SE or the drain electrode DE of the transistor T through a third contact hole CNT3 passing through the interlayer insulation layer ILD.

The first electrode E1 may include a metal material which is high in reflectivity. For example, the first electrode E1 may be provided in a multi-layer structure such as a stacked structure (titanium/aluminum/titanium (Ti/Al/Ti)) of Al and Ti, a stacked structure (indium tin oxide/Al/indium tin oxide (ITO/Al/ITO)) of Al and ITO, an APC (silver/palladium/ copper) alloy, or a stacked structure (ITO/APC/ITO) of an APC alloy and ITO, or may include a single-layer structure including one material or two or more alloy materials selected from among Ag, Al, molybdenum (Mo), gold (Au), magnesium (Mg), calcium (Ca), and barium (Ba).

A bank B may be provided at an end of the first electrode E1. Therefore, adjacent first electrodes E1 may be electrically insulated from each other, and emission efficiency may be prevented from being reduced by the concentration of a current on the end of the first electrode E1. The bank B, as illustrated in FIG. 5, may form an opening portion to expose the interlayer insulation layer ILD in the transmissive area TA2. The bank B may not be provided in the transmissive area TA2, thereby enhancing a transmittance of the transmissive area TA2. In other embodiments, the bank B may be provided in the transmissive area TA2. In detail, the bank B may extend from an end of one first electrode E1 to an end of another first electrode E1 disposed adjacent thereto.

The light emitting layer EL may be provided on the first electrode E1. The light emitting layer EL may include a hole transporting layer, an organic light emitting layer, and an electron transporting layer. In this case, a hole and an electron may move to the light emitting layer through the hole transporting layer and the electron transporting layer and may be combined in the organic light emitting layer to emit light.

The light emitting layer EL may include a red light emitting layer emitting red light, a green light emitting layer emitting green light, and a blue light emitting layer emitting blue light. The red light emitting layer, the green light emitting layer, and the blue light emitting layer may be patterned on the first electrode E1 in each pixel P. The red light emitting layer may be patterned in a red pixel, the green light emitting layer may be patterned in a green pixel, and the blue light emitting layer may be patterned in a blue pixel. However, the present disclosure is not limited thereto.

Alternatively, the light emitting layer EL may be a white light emitting layer emitting white light. In this case, the light emitting layer EL may be a common layer which is formed in the pixels P in common. The light emitting layer EL may be provided in a tandem structure of two or more stacks. Each of the stacks may include a hole transporting layer, at least one organic light emitting layer, and an electron transporting layer.

A charge generating layer may be provided between the stacks. The charge generating layer includes an n-type charge generating layer that is located adjacent to a lower stack and a p-type charge generating layer that is provided over the n-type charge generating layer and is located adjacent to an upper stack. The n-type charge generating layer injects electrons to the lower stack, and the p-type charge generating layer injects holes to the upper stack. The n-type charge generating layer may be formed of an organic layer which is doped with an alkali metal such as Li, Na, K, or Cs or an alkali earth metal such as Mg, Sr, Ba, or Ra. The p-type charge generating layer may be formed of an organic material having hole transportability which is doped with a dopant.

The second electrode E2 may be provided over the light emitting layer EL and the bank B. The second electrode E2 may be provided in a whole area of the pixel P. In detail, the second electrode E2 may be provided in the transmissive area TA2 as well as the non-transmissive area NTA2 including the emission area EA and the line area LA, but is not limited thereto. The second electrode E2 may be provided in only the non-transmissive area NTA2 including the emission area EA and the line area LA and may not be provided in the transmissive area TA2, for enhancing a transmittance. The second electrode E2 may be a common layer which is provided in the pixels P in common and applies the same voltage.

The second electrode E2 may include a transparent conductive material (TCO), such as indium tin oxide (ITO) or indium zinc oxide (IZO), or a semi-transmissive conductive material such as magnesium (Mg), silver (Ag), or an alloy of Mg and Ag, which transmit light. When the second electrode E2 is formed of the semi-transmissive conductive material, a micro-cavity may increase emission efficiency.

An encapsulation layer EN may be provided over the second electrode E2. The encapsulation layer EN may prevent penetration of external water into the light emitting device. The encapsulation layer EN may be formed of an inorganic layer or may be formed in a structure where an inorganic layer and an organic layer are alternately stacked, but is not limited thereto.

Although not shown in FIG. 5, a capping layer may be further formed between the second electrode E2 and the encapsulation layer EN.

A color filter CF may be provided over one surface of the second substrate 112 facing the first substrate 111. The color filter CF may be patterned in the emission area EA in each pixel P. In detail, the color filter CF may include a red color filter disposed to correspond to an emission area EA of the red pixel, a green color filter disposed to correspond to an emission area EA of the green pixel, and a blue color filter disposed to correspond to an emission area EA of the blue pixel.

In this case, the color filter CF provided in each pixel P may be formed to overlay the emission area EA. That is, the color filter CF may have the same area as that of a minimum emission area EA, but as illustrated in FIG. 5, may be provided to have an area which is wider than that of the emission area EA.

The transparent display panel 100 according to one or more embodiments of the present disclosure may be characterized by forming the color filter CF in the second substrate 112 without using a polarizer. When the polarizer is attached over the transparent display panel 100, a transmittance of the transparent display panel 100 may be reduced by the polarizer. When the polarizer is not attached over the transparent display panel 100, a problem where light incident from the outside is reflected by electrodes E1 and E2 may occur.

In the transparent display panel 100 according to one or more embodiments of the present disclosure, the polarizer may not be attached thereon, thereby preventing a reduction in transmittance. Also, in the transparent display panel 100 according to one or more embodiments of the present disclosure, the color filter CF may be formed in the second substrate 112 and may absorb a portion of light incident from the outside, thereby preventing the light from being reflected by the electrodes E1 and E2. That is, the transparent display panel 100 according to one or more embodiments of the present disclosure may decrease an external light reflectance without reducing a transmittance.

A black matrix BM may be provided between two adjacent color filters CF of a plurality of color filters CF. The black matrix BM may be patterned in the line area LA in each pixel P.

A plurality of lines for transferring a signal to each pixel P may be provided in the line area LA. The plurality of lines may include at least one of a driving voltage line (not shown) for transferring a first voltage supplied from a voltage supply unit (not shown), a common voltage line (not shown) for transferring a second voltage supplied from the voltage supply unit (not shown), a data line (not shown) for transferring a data voltage supplied from a data driver (not shown), and a reference line (not shown) and a gate line (not shown) for transferring a gate signal supplied from the gate driver 120.

The black matrix BM may be patterned in the line area LA and may prevent light incident from the outside from being reflected by the plurality of lines. Accordingly, the line area LA may correspond to a non-transmissive area which does not transmit incident light.

Moreover, the black matrix BM may be provided between adjacent pixels P and may prevent the occurrence of a mixed color between the adjacent pixels P.

The black matrix BM may include a light-absorbing material (for example, a black dye for absorbing all of light of a visible light wavelength band).

An inorganic layer PAS may be formed over the second substrate 112 including the color filter CF. In this case, the black matrix BM may be formed over the inorganic layer PAS.

In FIG. 5, the transparent display panel 100 is illustrated as being implemented as a top emission type, but is not limited thereto and may also be implemented as a bottom emission type. In the top emission type, light emitted from the light emitting layer EL may be irradiated in a direction toward the second substrate 112, and thus, the transistor T may be widely provided under the bank B and the first electrode E1. Accordingly, a design area of the transistor T may be wider in the top emission type than the bottom emission type.

As described above, each of the pixels P of the transparent display panel 100 according to one or more embodiments of the present disclosure may include the transmissive area TA2, which almost transmits light incident thereon, and the emission area EA which emits light. As a result, in one or more embodiments of the present disclosure, the transparent display panel 100 may enable a user to see a thing or a background placed over the rear surface thereof through the transmissive area TA2.

The gate driver 120 receives a gate control signal from the timing controller 160. The gate driver 120 may supply gate signals to the gate lines according to the gate control signal. The gate driver 120 may be provided in a non-display area NDA outside one side or both sides of a display area DA of the display substrate 110 in a gate driver-in panel (GIP) type. Alternatively, the gate driver 120 may be manufactured as a driving chip and may be mounted on a flexible film, and moreover, may be attached over the non-display area NDA outside the one side or the both sides of the display area DA of the display substrate 110 in a tape automated bonding (TAB) type.

The source drive IC 130 may receive digital video data and a source control signal from the timing controller 160. The source drive IC 130 may convert the digital video data into analog data voltages according to the source control signal and may supply the data voltages to the data lines. If the source drive IC 130 is fabricated of a driving chip, the source drive IC 130 may be packaged in the flexible film 140 in a chip on film (COF) or chip on plastic (COP) mode.

A size of the first substrate 111 may be greater than that of the second substrate 112, and thus, a portion of the first substrate 111 may be exposed without being overlaid by the second substrate 112. Pads such as data pads may be provided at the portion of the first substrate 111 which is exposed without being overlaid by the second substrate 112. Lines connecting the pads to the source drive IC 130 and lines connecting the pads to lines of the circuit board 150 may be provided in the flexible film 140. The flexible film 140 may be attached over the pads by using an anisotropic conductive film, and thus, the pads may be connected to the lines of the flexible film 140.

The circuit board 150 may be attached to the flexible films 140. A plurality of circuits comprised of driving chips may be packaged in the circuit board 150. For example, the timing controller 160 may be packaged in the circuit board 150. The circuit board 150 may be a printed circuit board or a flexible printed circuit board.

The timing controller 160 receives digital video data and a timing signal from an external system board. The timing controller 160 generates a gate control signal for controlling an operation timing of the gate driver and a source control signal for controlling the source drive ICs 130 on the basis of the timing signal. The timing controller 160 supplies the gate control signal to the gate driver 120, and supplies the source control signal to the source drive ICs 130.

The transparent display panel 100 according to one or more embodiments of the present disclosure may be characterized in that a transmittance of the non-display area NDA is similar to that of the display area DA. Hereinafter, features of the present disclosure will be described in detail with reference to FIGS. 6A and 6B.

Figure 6A:
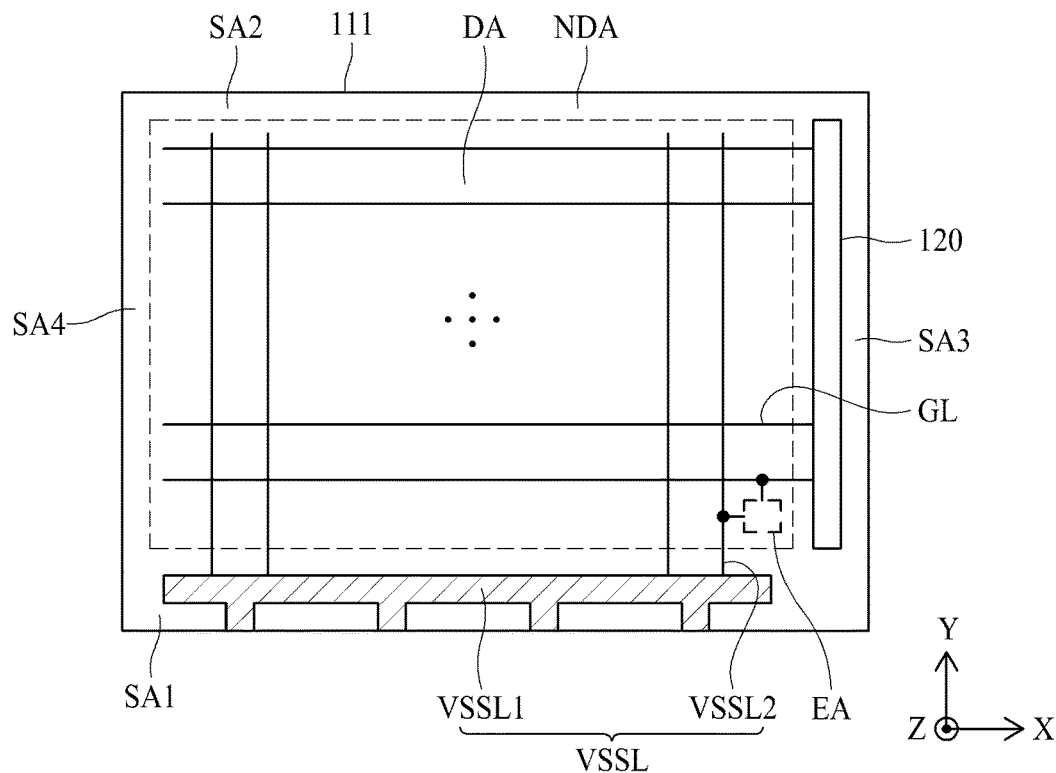
FIG. 6A is a plan view illustrating an example of a gate driver and a common voltage line each provided in a first substrate of a transparent display panel according to one or more embodiments of the present disclosure.
Figure 6B:
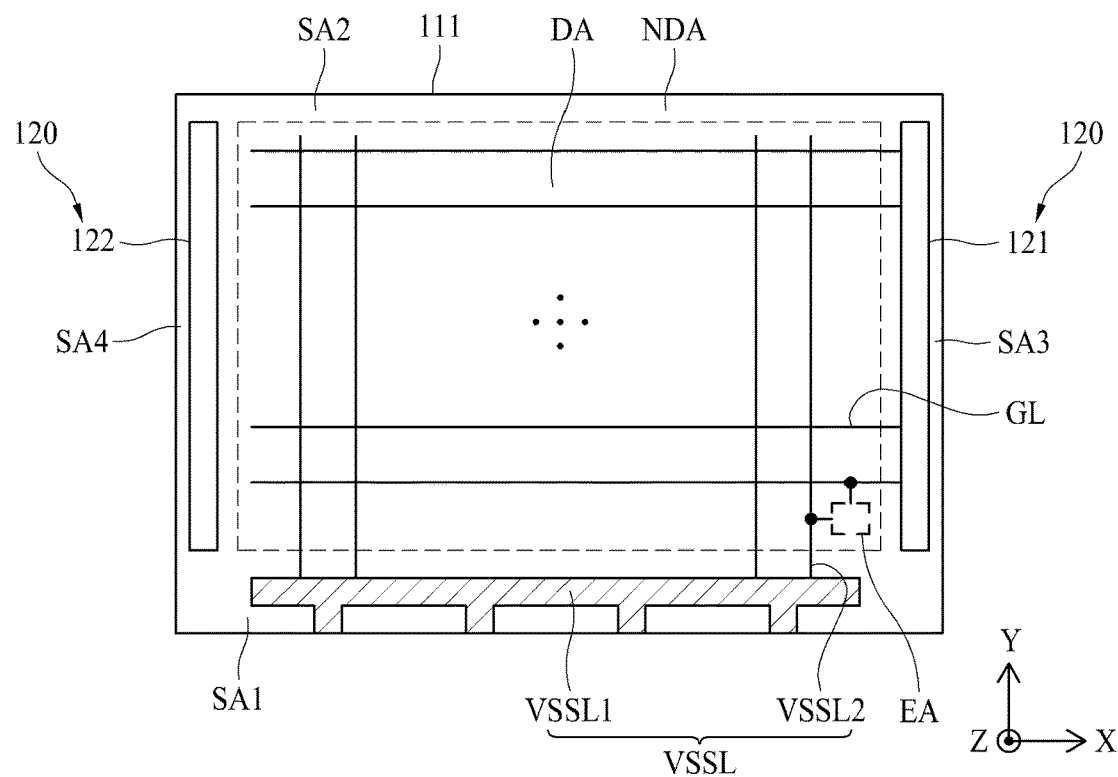
FIG. 6B is a plan view illustrating another example of a gate driver and a common voltage line each provided in a first substrate of a transparent display panel according to one or more embodiments of the present disclosure.

FIG. 6A is a plan view illustrating an example of a gate driver and a common voltage line each provided in a first substrate of a transparent display panel according to one or more embodiments of the present disclosure, and FIG. 6B is a plan view illustrating another example of a gate driver and a common voltage line each provided in a first substrate of a transparent display panel according to one or more embodiments of the present disclosure.

Referring to FIGS. 6A and 6B, a transparent display panel 100 according to one or more embodiments of the present disclosure may include a display area DA including a plurality of pixels P and a non-display area NDA adjacent to the display area DA.

The transparent display panel 100 according to one or more embodiments of the present disclosure may include a common voltage line VSSL which extends from the non-display area NDA to the display area DA.

The non-display area NDA may include a first side area SA1 provided at a first outer portion of the display area DA, a second side area SA2 facing the first side area SA1, and a third side area SA3 and a fourth side area SA4 which are provided between the first side area SA1 and the second side area SA2 to connect the first side area SA1 to the second side area SA2.

The common voltage line VSSL may include a first common voltage line VSSL1 and a plurality of second common voltage lines VSSL2.

The first common voltage line VSSL1 may be provided in the first side area SA1 of the non-display area NDA. The first common voltage line VSSL1 may extend by a certain length in a first direction (e.g., an X-axis direction) in the first side area SA1. The first common voltage line VSSL1 may be supplied with a second voltage from a power supply (not shown) mounted on a circuit board 150.

Each of the plurality of second common voltage lines VSSL2 may extend from the non-display area NDA to the display area DA. In detail, one end of each of the second common voltage lines VSSL2 may be connected to the first common voltage line VSSL1 and may be supplied with a second voltage through the first common voltage line VSSL1. Also, each of the second common voltage lines VSSL2 may extend in a second direction (e.g., a Y-axis direction) from the one end thereof and may be connected to a second electrode E2 of a light emitting device provided in the display area DA. Each of the second common voltage line VSSL2 may transfer the second voltage, supplied through the first common voltage line VSSL1, to a second electrode of a corresponding pixel P.

In the transparent display panel 100 according to one or more embodiments of the present disclosure, as described above, the first common voltage line VSSL1 may be provided in only the first side area SA1 of the non-display area NDA. Accordingly, in the transparent display panel 100 according to one or more embodiments of the present disclosure, the first common voltage line VSSL1 may not be provided in the second side area SA2, the third side area SA3, and the fourth side area SA4, thereby increasing a transmittance of the non-display area NDA.

Moreover, in the transparent display panel 100 according to one or more embodiments of the present disclosure, the plurality of second common voltage lines VSSL2 including one end connected to the first common voltage line VSSL1 and the other end extending to the display area DA may be provided. In the transparent display panel 100 according to one or more embodiments of the present disclosure, the second voltage may be stably provided to the second electrode E2 through the plurality of second common voltage lines VSSL2 extending from the non-display area NDA to the display area DA, without voltage drop.

In the transparent display panel 100 according to one or more embodiments of the present disclosure, as described above, the first common voltage line VSSL1 may not be disposed in the third side area SA3 and the fourth side area SA4. Therefore, comparing with a related art display panel, the transparent display panel 100 according to one or more embodiments of the present disclosure may include a spare space which is formed because the first common voltage line VSSL1 is removed from the third side area SA3 and the fourth side area SA4 of the non-display area NDA.

In the transparent display panel 100 according to one or more embodiments of the present disclosure, a width of a gate driver 120 may increase by using the spare space.

In detail, the transparent display panel 100 according to one or more embodiments of the present disclosure, the gate driver 120 may be provided in at least one of the third side area SA3 and the fourth side area SA4, which do not include the first common voltage line VSSL1. In FIG. 6A, the gate driver 120 is illustrated as being provided in the third side area SA3 of the non-display area NDA, but is not limited thereto. The gate driver 120 may be provided in the fourth side area SA4 of the non-display area NDA, but as illustrated in FIG. 6B, may be provided in all of the third side area SA3 and the fourth side area SA4.

The gate driver 120 may supply a gate signal to a plurality of gate lines GL on the basis of a gate control signal. In this case, the gate lines GL may extend in a first direction (e.g., an X-axis direction) and may be disposed vertical to the second common voltage lines VSSL2.

The gate driver 120 may include a plurality of stages for supplying the gate signal to each of the gate lines GL, and each of the stages may include a plurality of transistors.

Two or more of a plurality of transistors included in one stage may be arranged in one row in a direction i.e., the first direction (e.g., the X-axis direction) from the display area DA to the non-display area NDA. In this case, in the transparent display panel 100 according to one or more embodiments of the present disclosure, an interval between adjacent transistors may be widened, thereby enhancing a transmittance of the non-display area NDA.

As described above, in the transparent display panel 100 according to one or more embodiments of the present disclosure, the arrangement of the common voltage line VSSL and a plurality of transistors include in the gate driver 120 may be changed, and thus, a transmittance of the non-display area NDA may increase by a transmittance of the display area DA.

In the transparent display panel 100 according to one or more embodiments of the present disclosure, a transmittance of the non-display area NDA may be adjusted by adjusting a width of the first common voltage line VSSL1 and a separation distance between the plurality of transistors included in the gate driver 120. For example, a transmittance of the first side area SA1 of the non-display area NDA may increase by decreasing a width of the first common voltage line VSSL1. On the other hand, a transmittance of the first side area SA1 of the non-display area NDA may decrease by increasing a width of the first common voltage line VSSL1. As another example, a transmittance of the third side area SA3 or the fourth side area SA4 of the non-display area NDA may increase by increasing the separation distance between the plurality of transistors included in the gate driver 120. On the other hand, a transmittance of the third side area SA3 or the fourth side area SA4 of the non-display area NDA may decrease by decreasing the separation distance between the plurality of transistors included in the gate driver 120.

In the transparent display panel 100 according to one or more embodiments of the present disclosure, a difference between a transmittance of the non-display area NDA and a transmittance of the display area DA may be adjusted to 5% or less by adjusting a width of the first common voltage line VSSL1 and the separation distance between the plurality of transistors included in the gate driver 120. In this case, a user may not recognize a boundary between the display area DA and the non-display area NDA in the transparent display panel 100 and may recognize a whole surface as one area.

Referring again to FIG. 2, a cover substrate 200 may include plastic or glass and may be disposed over the transparent display panel 100. In FIG. 2, the transparent display panel 100 is illustrated as the bottom emission type, but is not limited thereto. The cover substrate 200 may be disposed in a direction in which the transparent display panel 100 emits light. Therefore, when the transparent display panel 100 is the top emission type, the cover substrate 200 may be disposed over the transparent display panel 100, namely, over the second substrate 112. On the other hand, when the transparent display panel 100 is the bottom emission type, the cover substrate 200 may be disposed under the transparent display panel 100, namely, over the first substrate 111. Hereinafter, for convenience of description, an example where the transparent display panel 100 is the top emission type will be described.

The cover substrate 200 may include a first area A1 overlapping the transparent display panel 100 and a second area A2 adjacent to the first area A1. In some embodiments, the second area A2 surrounds the first area A1.

The cover substrate 200 may include a second adhesive layer 230 in the first area A1 and may be attached over the transparent display panel 100 by the second adhesive layer 230.

The cover substrate 200 may include a dummy pattern layer 220 in the second area A2. A transmittance of the second area A2 of the cover substrate 200 may be adjusted by the dummy pattern layer 220. The cover substrate 200 according to one or more embodiments of the present disclosure may be characterized by having a transmittance similar to a transmittance of the transparent display panel 100 in the second area A2.

Hereinafter, the cover substrate 200 will be described in more detail with reference to FIGS. 7 to 11.

Figure 7:
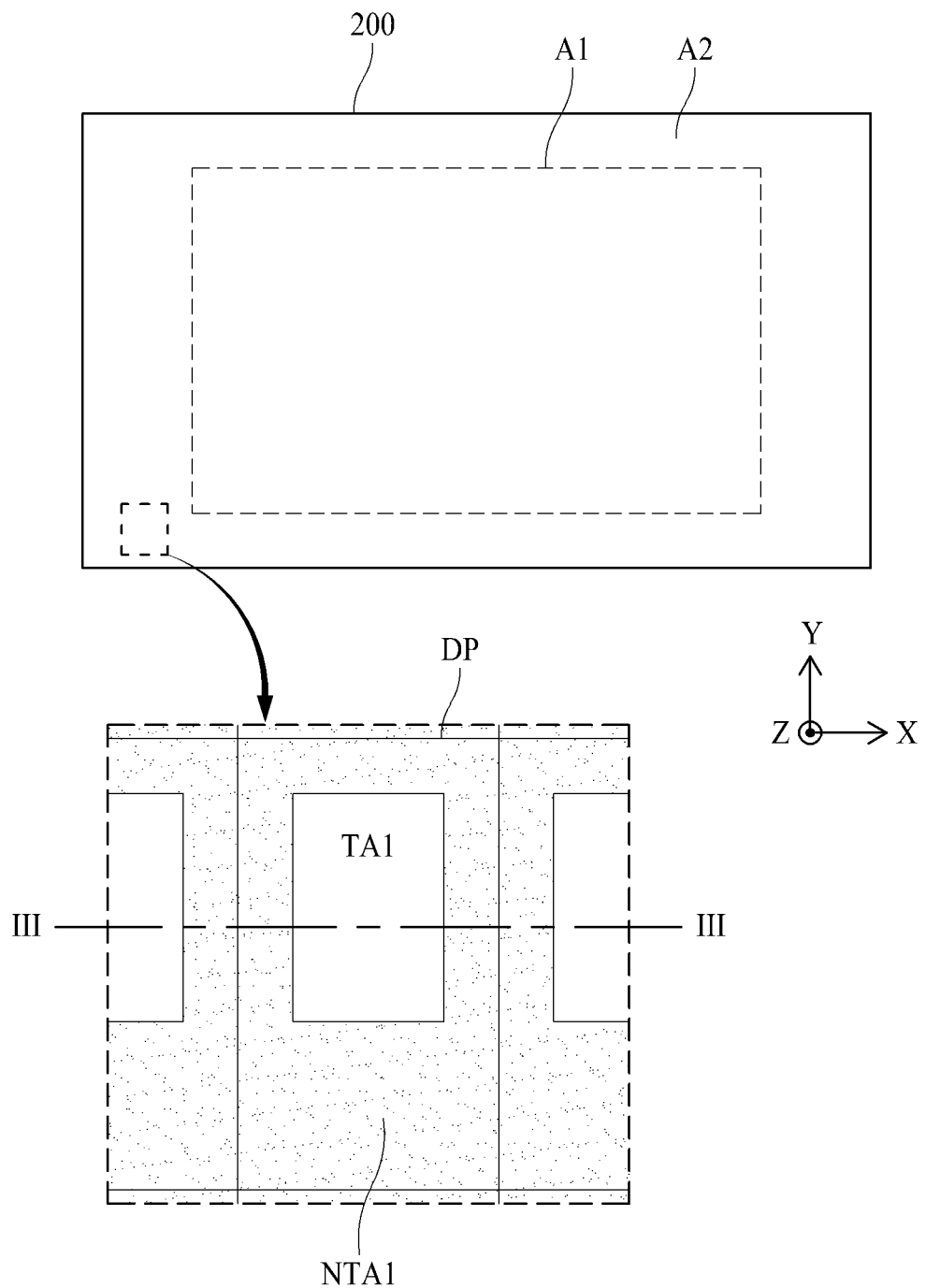
FIG. 7 is a plan view illustrating an example of the cover substrate illustrated in FIG. 1.
Figure 8:
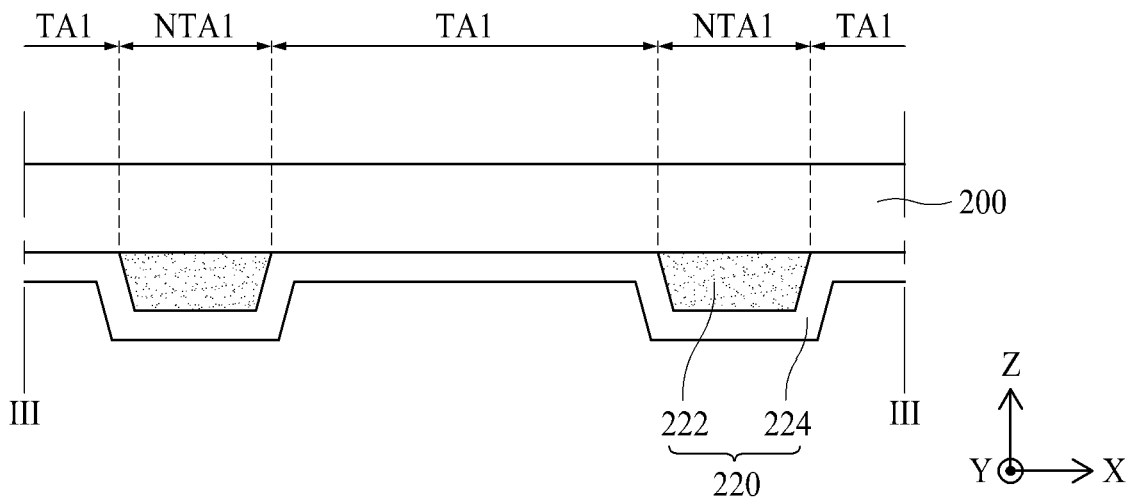
FIG. 8 is a cross-sectional view taken along line of FIG. 7.

FIG. 7 is a plan view illustrating an example of the cover substrate illustrated in FIG. 1, and FIG. 8 is a cross-sectional view taken along line of FIG. 7.

The cover substrate 200, as illustrated in FIG. 7, may include a first area A1 overlapping the transparent display panel 100 and a second area A2 adjacent to the first area A1. In this case, an edge of the first area A1 may correspond to an edge of the transparent display panel 100.

A plurality of dummy patterns DP may be provided over one surface of the cover substrate 200 facing the transparent display panel 100. Particularly, the plurality of dummy patterns DP may be provided in the second area A2 of the cover substrate 200. Here, each of the plurality of dummy patterns DP included in the cover substrate 200 may have a shape or a size, which is the same as or similar to that of a pixel P provided in the display area DA, but may not emit light unlike the pixel P. The plurality of dummy patterns DP may be disposed to contact each other, but are not limited thereto. The plurality of dummy patterns DP may be disposed apart from one another.

Each of the plurality of dummy patterns DP, as in FIGS. 7 and 8, may include a transmissive area TA1 and a non-transmissive area NTA1. The transmissive area TA1 may be an area which transmits light incident thereon, and the non-transmissive area NTA1 may be an area which hardly transmits light incident thereon. Each of the plurality of dummy patterns DP may enable a user to see a thing or a background placed over a rear surface of the cover substrate 200 through the transmissive area TA1.

The dummy pattern DP included in the cover substrate 200 may have a shape which is the same as or similar to that of the pixel P included in the transparent display panel 100.

In more detail, a transmissive area TA1 (hereinafter referred to as "a first transmissive area") of the dummy pattern DP may have the same shape as that of a transmissive area TA2 (hereinafter referred to as "a second transmissive area") of the pixel P included in the transparent display panel 100.

For example, when the second transmissive area TA2 of the pixel P included in the transparent display panel 100 has a tetragonal shape, the first transmissive area TA1 of the dummy pattern DP may have a hexagonal shape. As another example, when the second transmissive area TA2 of the pixel P included in the transparent display panel 100 has a tetragonal shape, the first transmissive area TA1 of the dummy pattern DP may have a hexagonal shape.

A non-transmissive area NTA1 (hereinafter referred to as "a first non-transmissive area") of the dummy pattern DP may have the same shape as that of a non-transmissive area NTA2 (hereinafter referred to as "a second non-transmissive area") of the pixel P included in the transparent display panel 100.

The second non-transmissive area NTA2 of the pixel P included in the transparent display panel 100 may include a light emitting device and may include an emission area EA emitting light and a line area LA including a plurality of lines connected to the light emitting device. A light emitting device and a plurality of lines connected to the light emitting device may not be provided in the dummy pattern DP included in the cover substrate 200 unlike the pixel P of the transparent display panel 100, but the first non-transmissive area NTA1 having the same shape as that of the second non-transmissive area NTA2 of the pixel P may be provided in the dummy pattern DP.

Therefore, in the transparent display apparatus 10 according to one or more embodiments of the present disclosure, a first transmittance of an area where a part of the cover substrate 200 does not overlap the transparent display panel 100 may be the same as or similar to a second transmittance of an area where other part of the cover substrate 200 overlaps the transparent display panel 100.

In the transparent display apparatus 10, only the first non-transmissive area NTA1 may be provided in the second area A2 of the cover substrate 200, or only the first transmissive area TA1 may be provided in the second area A2. However, when only the first non-transmissive area NTA1 is provided in the second area A2 of the cover substrate 200, the first transmittance of the area where the part of the cover substrate 200 does not overlap the transparent display panel 100 may be close to 1%, and thus, may have a large difference with the second transmittance of the area where the other part of the cover substrate 200 overlaps the transparent display panel 100. Also, when only the first transmissive area TA1 is provided in the second area A2 of the cover substrate 200, the first transmittance of the area where the part of the cover substrate 200 does not overlap the transparent display panel 100 may be close to 100%, and thus, may have a large difference with the second transmittance of the area where the other part of the cover substrate 200 overlaps the transparent display panel 100. Therefore, a sense of difference between the cover substrate 200 and the transparent display panel 100 may occur.

In the transparent display apparatus 10 according to one or more embodiments of the present disclosure, the first non-transmissive area NTA1 as well as the first transmissive area TA1 may be provided in the second area A2 of the cover substrate 200, thereby decreasing a difference between the first transmittance of the area, where the part of the cover substrate 200 does not overlap the transparent display panel 100, and the second transmittance of the area where the other part of the cover substrate 200 overlaps the transparent display panel 100.

Furthermore, the transparent display apparatus 10 according to one or more embodiments of the present disclosure may be implemented so that the first transmissive area TA1 of the dummy pattern DP provided in the second area A2 of the cover substrate 200 has the same shape as that of the second transmissive area TA2 of the pixel P provided in the display area DA of the transparent display panel 100. Also, the transparent display apparatus 10 according to one or more embodiments of the present disclosure may be implemented so that the first non-transmissive area NTA1 of the dummy pattern DP provided in the second area A2 of the cover substrate 200 has the same shape as that of the second non-transmissive area NTA2 of the pixel P provided in the display area DA of the transparent display panel 100.

Therefore, in the transparent display apparatus 10 according to one or more embodiments of the present disclosure, a difference between the first transmittance of the area where the part of the cover substrate 200 does not overlap the transparent display panel 100 and the second transmittance of the area where the other part of the cover substrate 200 overlaps the transparent display panel 100 may decrease to 5% or less.

In order to decrease a difference between the first transmittance and the second transmittance, the transparent display apparatus 10 according to one or more embodiments of the present disclosure may be implemented so that the first transmissive area TA1 of the dummy pattern DP provided in the second area A2 of the cover substrate 200 has the same size as that of the second transmissive area TA2 of the pixel P provided in the display area DA of the transparent display panel 100. Also, the transparent display apparatus 10 according to one or more embodiments of the present disclosure may be implemented so that the first non-transmissive area NTA1 of the dummy pattern DP provided in the second area A2 of the cover substrate 200 has the same size as that of the second non-transmissive area NTA2 of the pixel P provided in the display area DA of the transparent display panel 100.

When the shape and size of the dummy pattern P are set to be equal to those of the pixel P, the number of dummy patterns P per unit area may be the same as the number of pixels P per unit area. Also, a width of the first non-transmissive area NTA1 per unit area may be the same as a width of the second non-transmissive area NTA2 per unit area.

Therefore, in the transparent display apparatus 10 according to one or more embodiments of the present disclosure, a difference between the first transmittance of the area where the part of the cover substrate 200 does not overlap the transparent display panel 100 and the second transmittance of the area where the other part of the cover substrate 200 overlaps the transparent display panel 100 may decrease to about 0%.

However, the above description may not be based on a transmittance of the cover substrate 200, a transmittance of the color correction layer 224, and a transmittance of each of a plurality of layers included in the transparent display panel 100.

The first transmittance of the area where the part of the cover substrate 200 does not overlap the transparent display panel 100 may be affected by the transmittance of the cover substrate 200 and the transmittance of the color correction layer 224. The transmittance of the cover substrate 200 or the transmittance of the color correction layer 224 may not be 100%, and for example, may be 90% or less. However, when the cover substrate 200 has a low transmittance, the cover substrate 200 may be provided over the transparent display panel 100, and thus, the transmittance of the cover substrate 200 may not be considered in designing the dummy pattern DP. On the other hand, when the color correction layer 224 has a low transmittance, the color correction layer 224 may not be provided over the transparent display panel 100, and thus, the transmittance of the color correction layer 224 may not be considered in designing the dummy pattern DP.

In one or more embodiments, when the color correction layer 224 has a low transmittance (for example, less than 90%), a size of the dummy pattern DP may be set to be less than that of the pixel P.

In another embodiment, when the color correction layer 224 has a low transmittance (for example, less than 90%), the number of dummy patterns DP per unit area may be set to be less than the number of pixels P per unit area. In this case, the shape and size of the dummy pattern DP may be the same as those of the pixel P. Therefore, a width of the first non-transmissive area NTA1 per unit area may be less than a width of the second non-transmissive area NTA2 per unit area. A width of the first non-transmissive area NTA1 per unit area may be reduced, thereby decreasing a reduction in transmittance of the dummy pattern DP caused by the first non-transmissive area NTA1.

In another embodiment, when the color correction layer 224 has a low transmittance (for example, less than 90%), a size of the first transmissive area TA1 of the dummy pattern DP may be set to be greater than that of the second transmissive area TA2 of the pixel P. In this case, a size of the dummy pattern DP may be set to be equal to that of the pixel P, and only a size of the first transmissive area TA1 of the dummy pattern DP may be set to be greater than that of the second transmissive area TA2 of the pixel P. In this case, a size of the first non-transmissive area NTA1 of the dummy pattern DP may be set to be less than that of the second non-transmissive area NTA2 of the pixel P. Therefore, a width of the first non-transmissive area NTA1 per unit area may be less than a width of the second non-transmissive area NTA2 per unit area.

The first transmittance of the area where the part of the cover substrate 200 does not overlap the transparent display panel 100 may be affected by a transmittance of the cover substrate 200 and a transmittance of each of a plurality of layers included in the transparent display panel 100. The transmittance of the cover substrate 200 or the transmittance of each of the plurality of layers included in the transparent display panel 100 may not be 100%, and for example, may be less than 90%. However, when the cover substrate 200 has a low transmittance, the cover substrate 200 may be provided over the dummy pattern DP, and thus, the transmittance of the cover substrate 200 may not be considered in designing the dummy pattern DP. On the other hand, when each of the plurality of layers included in the transparent display panel 100 has a low transmittance, the plurality of layers may not be provided in the transparent display panel 100, and thus, the dummy pattern DP may be designed based on a transmittance of each of the plurality of layers included in the transparent display panel 100.

In one or more embodiments, when each of the plurality of layers included in the transparent display panel 100 has a low transmittance (for example, less than 90%), the size of the dummy pattern DP may be set to be greater than that of the pixel P.

In another embodiment, when each of the plurality of layers included in the transparent display panel 100 has a low transmittance (for example, less than 90%), a size of the first transmissive area TA1 of the dummy pattern DP may be set to be less than that of the second transmissive area TA2 of the pixel P. In this case, a size of the dummy pattern DP may be set to be equal to that of the pixel P, and only a size of the first transmissive area TA1 of the dummy pattern DP may be set to be less than that of the second transmissive area TA2 of the pixel P. In this case, a size of the first non-transmissive area NTA1 of the dummy pattern DP may be set to be greater than that of the second non-transmissive area NTA2 of the pixel P. Therefore, a width of the first non-transmissive area NTA1 per unit area may be greater than a width of the second non-transmissive area NTA2 per unit area. A width of the first non-transmissive area NTA1 per unit area may be enlarged, thereby increasing a reduction in transmittance of the dummy pattern DP caused by the first non-transmissive area NTA1.

The dummy pattern DP, as illustrated in FIG. 8, may include a light blocking pattern 222 and the color correction layer 224.

The light blocking pattern 222 may be provided over one surface of the cover substrate 200 facing the transparent display panel 100. The light blocking pattern 222 may be provided in the first non-transmissive area NTA1 of the dummy pattern DP, and thus, may not transmit light incident thereon. To this end, the light blocking pattern 222 may include a light-absorbing material (for example, a black dye for absorbing all of light of a visible light wavelength band).

The color correction layer 224 may be provided over the one surface of the cover substrate 200 facing the transparent display panel 100. The color correction layer 224 may be provided in the first transmissive area TA1 of the dummy pattern DP and may transmit light incident thereon. The color correction layer 224 may be provided over the light blocking pattern 222 to overlay the light blocking pattern 222.

The color correction layer 224 may include an organic material, and in one or more embodiments, may further include a material which reflects light of a wavelength band of a specific color. When the color correction layer 224 includes a material which reflects light of a wavelength band of a specific color, the dummy pattern DP may transmit a portion of light incident at the first transmissive area TA1 and may reflect the other light. For example, the color correction layer 224 may include a dye which has one of red, green, blue, and yellow or has a mixed color thereof.

Due to the color correction layer 224, the first transmissive area TA1 of the dummy pattern DP may have a color sense (or in some cases, an impression of a color) of an image displayed by the transparent display panel 100. For example, based on the functionality or the operation of the color correction layer 224, the first transmissive area TA1 of the dummy pattern DP has a color sense range of the image displayed on the transparent display panel 100. Typically, when white light is emitted from the transparent display panel 100, a sense of color or an impression of a color may differ based on the characteristics of the product. For example, when the transparent display panel 100 emits white light, a sense of color may be yellowish, reddish, or greenish due to the product housing the transparent display panel 100. In other examples, when the transparent display panel 100 emits white light, a sense of color may be yellowish, reddish, or greenish due to the color of the product because the display panel is transparent. The white light emitted from the transparent display panel 100 having a yellowish, reddish, or greenish color sense may be based on other various reasons of the product and would be readily apparent to a person skilled in the art beyond those reasons mentioned herein.

In the transparent display apparatus 10 according to one or more embodiments of the present disclosure, the color correction layer 224 may include a material which reflects light of a wavelength band of a specific color, and thus, may have a sense of color, which is the same as or similar to that of the transparent display panel 100, in an area where the part of the cover substrate 200 does not overlap the transparent display panel 100.

For example, when a sense of color of the transparent display panel 100 is yellowish, the color correction layer 224 may include an organic material and a dye having a yellow color. Therefore, a yellowish color may be implemented in the area where the part of the cover substrate 200 does not overlap the transparent display panel 100, thereby removing a sense of difference between the cover substrate 200 and the transparent display panel 100.

As another example, when a sense of color of the transparent display panel 100 is transparent, the color correction layer 224 may include only an organic material. Therefore, a transparent color may be implemented in the area where the part of the cover substrate 200 does not overlap the transparent display panel 100, thereby removing a sense of difference between the cover substrate 200 and the transparent display panel 100.

In FIG. 7, it is illustrated that the dummy pattern DP is uniformly disposed in the second area A2, but the present embodiment is not limited thereto.

Hereinafter, a modified embodiment where the dummy pattern DP is non-uniformly disposed in the second area A2 will be described with reference to FIGS. 9 and 10.

Figure 9:
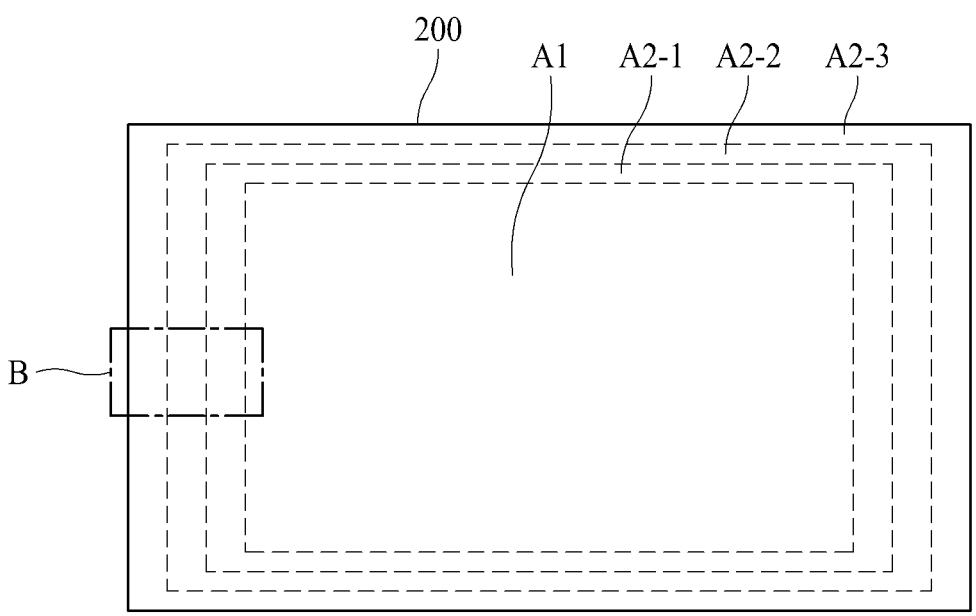
FIG. 9 is a plan view illustrating another example of the cover substrate illustrated in FIG. 1.
Figure 10:
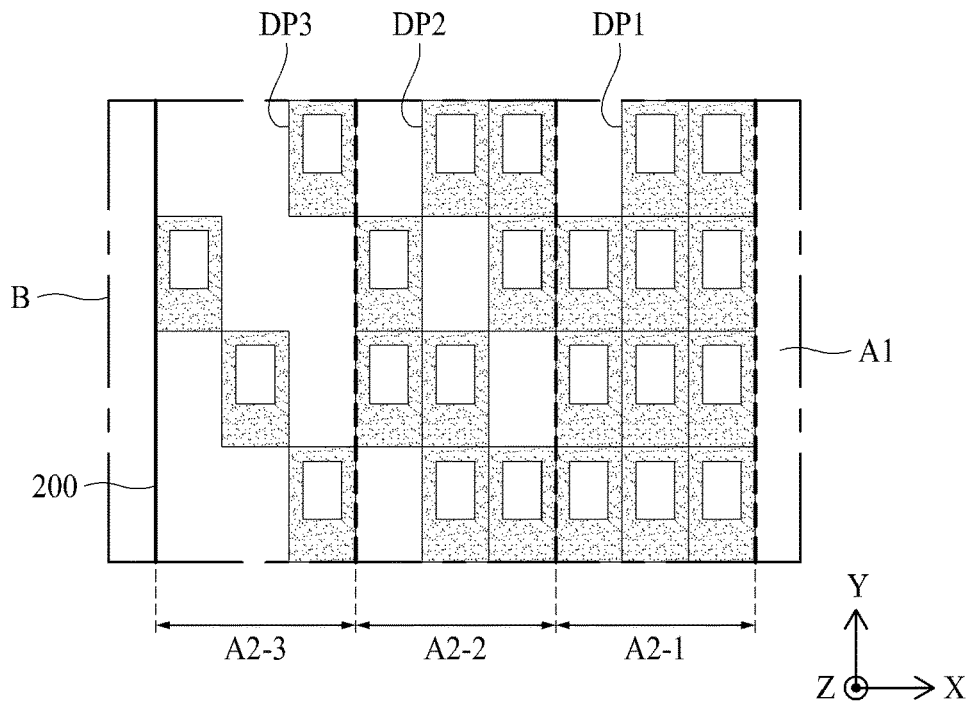
FIG. 10 is an enlarged view of a region B of FIG. 9.

FIG. 9 is a plan view illustrating another example of the cover substrate illustrated in FIG. 1, and FIG. 10 is an enlarged view of a region B of FIG. 9.

A cover substrate 200, as illustrated in FIG. 9, may include a first area A1 overlapping a transparent display panel 100 and a second area A2 adjacent to the first area A1. A plurality of dummy patterns DP may be provided over one surface of the cover substrate 200 facing the transparent display panel 100. Particularly, the plurality of dummy patterns DP may be provided in the second area A2 of the cover substrate 200. Here, each of the plurality of dummy patterns DP may have a shape or a size, which is the same as or similar to that of a pixel P provided in a display area DA of the transparent display panel 100, but may not emit light unlike the pixel P. The plurality of dummy patterns DP may be disposed to contact each other, but are not limited thereto. The plurality of dummy patterns DP may be disposed apart from one another.

Each of the plurality of dummy patterns DP may include a transmissive area TA1 and a non-transmissive area NTA1. The transmissive area TA1 may be an area which transmits light incident thereon, and the non-transmissive area NTA1 may be an area which hardly transmits light incident thereon. Each of the plurality of dummy patterns DP may enable a user to see a thing or a background placed over a rear surface of the cover substrate 200 through the transmissive area TA1.

The dummy pattern DP illustrated in FIGS. 9 and 10 may be an element which is substantially the same as the dummy pattern DP illustrated in FIGS. 7 and 8, and thus, its detailed description is omitted.

In the cover substrate 200 according to a modified embodiment of the present disclosure, the second area A2 may include a plurality of division areas A2-1, A2-2, and A2-3. In detail the second area A2 may include a first division area A2-1 surrounding the first area A1, a second division area A2-2 surrounding the first division area A2-1, and a third division area A2-3 surrounding the second division area A2-2. In FIGS. 9 and 10, three division areas A2-1, A2-2, and A2-3 are illustrated, but the present embodiment is not limited thereto. The second area A2 may include two division areas or four or more division areas.

A transmittance of each of the division areas A2-1, A2-2, and A2-3 may increase in a direction distancing from the first area A1. In detail, a plurality of dummy patterns DP may be provided in each of the division areas A2-1, A2-2, and A2-3. In this case, the number of dummy patterns DP of each of the division areas A2-1, A2-2, and A2-3 per unit area may be inversely proportional to a distance to the first area A1.

A first dummy pattern DP1 may be provided in the first division area A2-1, a second dummy pattern DP2 may be provided in the second division area A2-2, and a third dummy pattern DP3 may be provided in the third division area A2-3. The first to third dummy patterns DP1 to DP3 may have the same shape and size.

The number of first dummy patterns DP1 per unit area may be larger than the number of second dummy patterns DP2 per unit area. For example, as illustrated in FIG. 10, eleven first dummy patterns DP1 may be provided in a certain area in the first division area A2-1, and eight second dummy patterns DP2 may be provided in a certain area in the second division area A2-2. In this case, a width of a non-transmissive area NTA1 per unit area in the first division area A2-1 may be greater than a width of a non-transmissive area NTA1 per unit area in the second division area A2-2. Accordingly, since a width of the non-transmissive area NTA1 per unit area in the first division area A2-1 is greater than a width of the non-transmissive area NTA1 per unit area in the second division area A2-2, a transmittance of the first division area A2-1 may be less than that of the second division area A2-2. In this case, a difference between a transmittance of the first division area A2-1 and a transmittance of the transparent display panel 100 may be adjusted to 5% or less. To this end, the number of first dummy patterns DP1 per unit area in the first division area A2-1 may be determined based on a transmittance of the transparent display panel 100.

The number of second dummy patterns DP2 per unit area may be larger than the number of third dummy patterns DP3 per unit area. For example, as illustrated in FIG. 10, eight second dummy patterns DP2 may be provided in a certain area in the second division area A2-2, and four third dummy patterns DP3 may be provided in a certain area in the third division area A2-3. In this case, a width of a non-transmissive area NTA1 per unit area in the second division area A2-2 may be greater than a width of a non-transmissive area NTA1 per unit area in the third division area A2-3. Accordingly, since a width of a non-transmissive area NTA1 per unit area in the second division area A2-2 is greater than a width of a non-transmissive area NTA1 per unit area in the third division area A2-3, a transmittance of the second division area A2-2 may be less than that of the third division area A2-3.

As a result, a transmittance of the second area A2 may increase in the order of the first division area A2-1, the second division area A2-2, and the third division area A2-3.

In the cover substrate 200 according to a modified embodiment of the present disclosure, the second area A2 may be divided into the plurality of division areas A2-1, A2-2, and A2-3, and the plurality of dummy patterns DP may be provided in each of the division areas A2-1, A2-2, and A2-3. In the cover substrate 200 including the dummy patterns DP, a transmittance of each of the division areas A2-1, A2-2, and A2-3 may increase in a direction distancing from the first area A1, thereby reducing a sense of difference between the transparent display panel 100 and the cover substrate 200.

Figure 11:
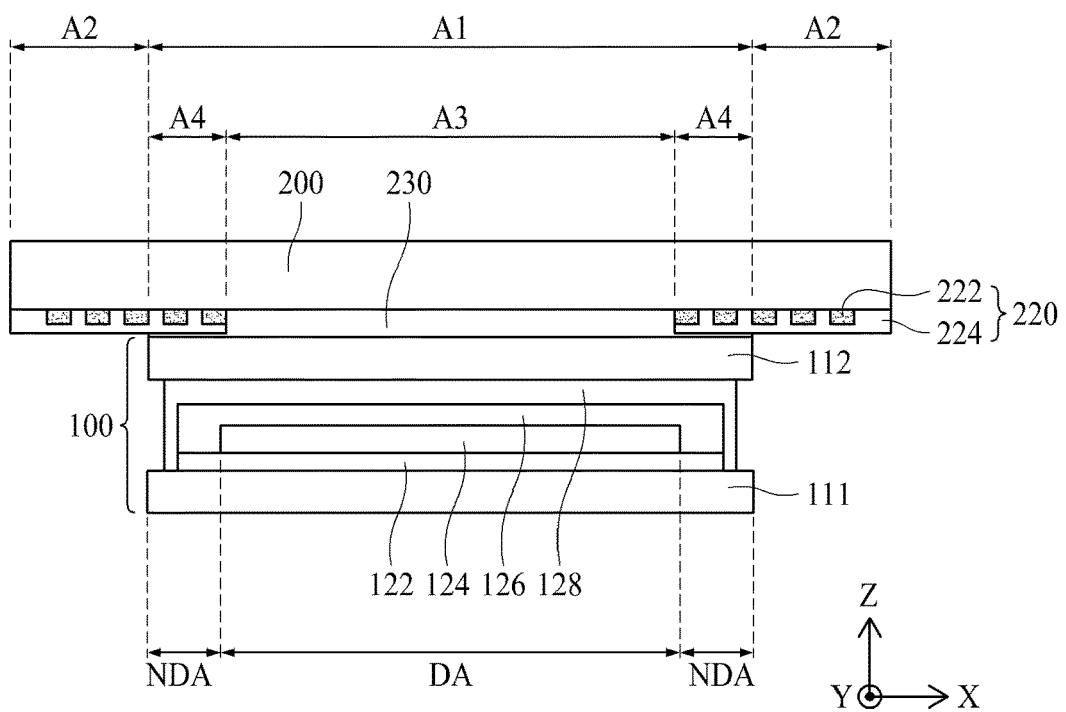
FIG. 11 is a cross-sectional view illustrating a modified embodiment of FIG. 2.

FIG. 11 is a cross-sectional view illustrating a modified embodiment of FIG. 2.

In FIG. 2, the dummy pattern layer 220 is illustrated as being provided in only the second area A2 of the cover substrate 200, but the present disclosure is not limited thereto. A dummy pattern layer 220, as illustrated in FIG. 11, may be provided at a portion of a first area A1 of a cover substrate 200. Hereinafter, description which is the same as or similar to the embodiment of FIG. 2 is omitted, and a difference therebetween will be mainly described.

A cover substrate 200 may include a first area A1 overlapping a transparent display panel 100 and a second area A2 surrounding the first area A1. In this case, an edge of the first area A1 may correspond to an edge of the transparent display panel 100.

Moreover, as illustrated in FIG. 11, the first area A1 of the cover substrate 200 may include a third area A3 overlapping a display area DA of the transparent display panel 100 and a fourth area A4 overlapping a non-display area NDA of the transparent display panel 100. In this case, an edge of the third area A3 may correspond to an edge of the display area DA of the transparent display panel 100.

A dummy pattern layer 220 may be provided in the fourth area A4 as well as the second area A2 of the cover substrate 200. That is, the dummy pattern layer 220 may be provided in an area, other than an area where a pixel P is provided, of the transparent display panel 100.

The transparent display panel 100, as described above, may have a high transmittance in the non-display area NDA as well as the display area DA. In this case, the transparent display panel 100 may have a transmittance which is higher in the non-display area NDA than the display area DA. In this case, in the transparent display apparatus 10, a transmittance of an area corresponding to the third area A3 of the cover substrate 200 may differ from a transmittance of an area corresponding to the fourth area A4 of the cover substrate 200, and a difference may be recognized by a user.

In the cover substrate 200 according to a modified embodiment of the present disclosure, the dummy pattern layer 220 may be provided in the fourth area A4 corresponding to the non-display area NDA, thereby decreasing a difference between a transmittance of an area corresponding to the third area A3 of the cover substrate 200 and a transmittance of an area corresponding to the fourth area A4 of the cover substrate 200.

Figure 12:
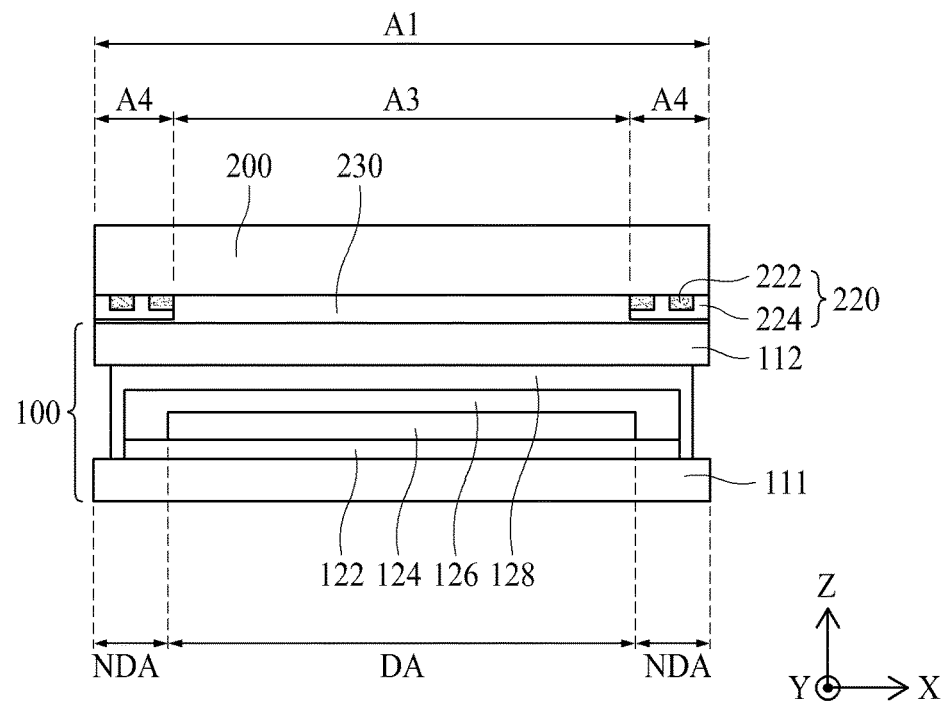
FIG. 12 is a cross-sectional view illustrating another modified embodiment of FIG. 2.

FIG. 12 is a cross-sectional view another modified embodiment of FIG. 2.

In FIG. 2, it is illustrated that the cover substrate 200 is implemented to be larger than the transparent display panel 100, but the present disclosure is not limited thereto. The cover substrate 200, as illustrated in FIG. 12, may have the same size as that of the transparent display panel 100. Hereinafter, description which is the same as or similar to the embodiment of FIG. 2 is omitted, and a difference therebetween will be mainly described.

A cover substrate 200 may include only a first area A1 overlapping a transparent display panel 100. Also, as illustrated in FIG. 12, the first area A1 of the cover substrate 200 may include a third area A3 overlapping a display area DA of the transparent display panel 100 and a fourth area A4 overlapping a non-display area NDA of the transparent display panel 100.

A dummy pattern layer 220 may be provided in the fourth area A4. That is, the dummy pattern layer 220 may be provided in an area, other than an area where a pixel P is provided, of the transparent display panel 100.

Figure 13A:
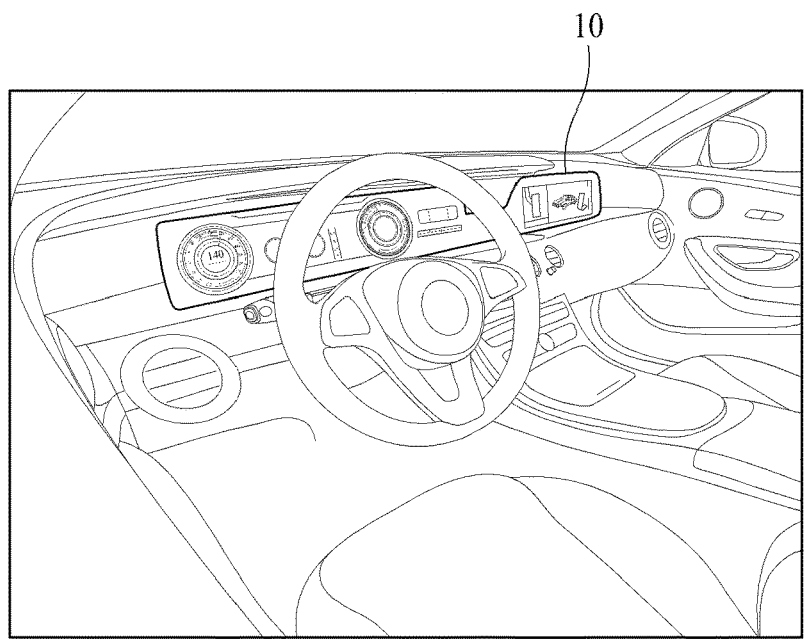
FIG. 13A is a diagram illustrating an example in which a transparent display apparatus according to one or more embodiments of the present disclosure is applied to a vehicle.
Figure 13B:
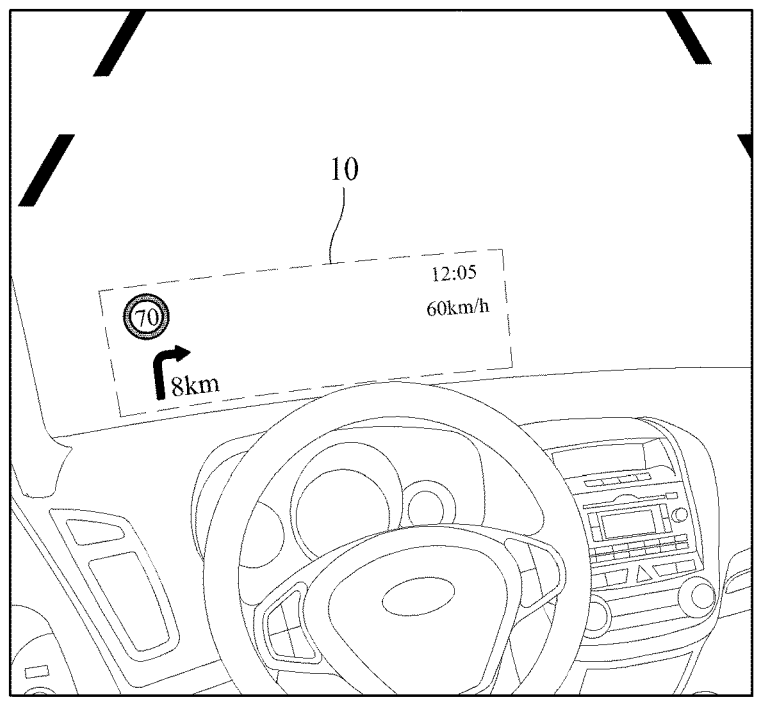
FIG. 13B is a diagram illustrating another example in which a transparent display apparatus according to one or more embodiments of the present disclosure is applied to a vehicle.
Figure 13C:
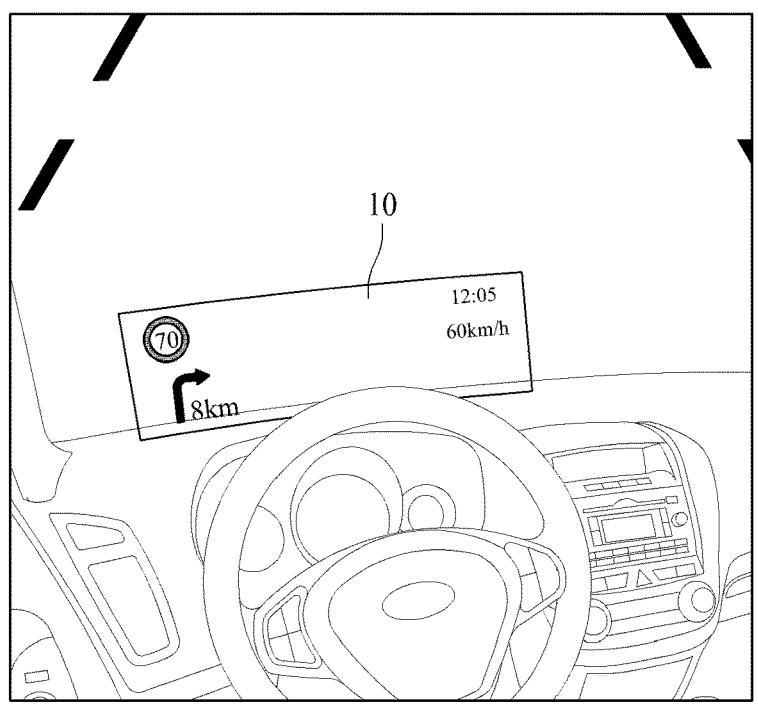
FIG. 13C is a diagram illustrating another example in which a transparent display apparatus according to one or more embodiments of the present disclosure is applied to a vehicle.

The transparent display apparatus 10 described above may be equipped in a vehicle. For example, as illustrated in FIGS. 13A and 13B, the transparent display apparatus 10 may be implemented inside the vehicle. The transparent display apparatus 10, as illustrated in FIG. 13A, may be disposed behind a handle of the vehicle and may display information needed for driving of the vehicle. As another example, as illustrated in FIG. 13B, the transparent display apparatus 10 may be disposed at the front window (or on the front window) of the vehicle so as to enable the driver to see the information needed for driving of the vehicle with raising the driver's head and may display the information needed for driving of the vehicle. In some embodiments, because the front window of the vehicle or the windshield of the vehicle has a curvature, the image displayed by the transparent display apparatus 10 may be adjusted to compensate for the curvature so that a driver of the vehicle can easily view the image displayed. As another example, as illustrated in FIG. 13C, the transparent display apparatus 10 may be disposed between the handle and the front window of the vehicle and may display the information needed for driving of the vehicle. In this case, the transparent display apparatus 10 equipped in the vehicle may display an image corresponding to a speedometer, a tachometer, a fuel gauge, an odometer, a coolant thermometer, a turn signal indicator, a low fuel warning light, an alternator warning light, a signal lamp, a clock, or the like. Also, the transparent display apparatus 10 equipped in the vehicle may display a navigation screen for displaying a map or a road to a destination of the map.

In the present disclosure, a dummy pattern may be provided over one surface of a cover substrate. In this case, the dummy pattern may be provided in an area which does not overlap a display area of a transparent display panel including a pixel and may include a non-transmissive area having the same shape as that of the pixel of the transparent display panel. Accordingly, the present disclosure may decrease a difference between a first transmittance of an area, where a part of the cover substrate does not overlap the display area of the transparent display panel, and a second transmittance of an area where other part of the cover substrate overlaps the display area of the transparent display panel, thereby preventing a sense of difference between the transparent display panel and the cover substrate.

Moreover, in the present disclosure, the dummy pattern may be implemented with only a light blocking pattern and a color correction layer, and the color correction layer may include a material which reflects light of a wavelength band of a specific color. Accordingly, in the present disclosure, an area where the part of the cover substrate does not overlap the display area of the transparent display panel may have color sensitivity which is the same as or similar to that of an area where the other part of the cover substrate overlaps the display area of the transparent display panel.

Moreover, in the present disclosure, a second common voltage line extending from a non-display area to the display area may be provided, and thus, a first common voltage line may be provided in only one area of the non-display area. Accordingly, according to the present disclosure, a transmittance of the non-display area may be enhanced.

Moreover, in the present disclosure, a transmittance of the non-display area may be more enhanced by adjusting a separation distance between a plurality of transistors included in a gate driver.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transparent display apparatus, comprising:
   a transparent display panel including a first substrate, a second substrate, and a plurality of pixels provided between the first substrate and the second substrate, the transparent display panel having a display area including the plurality of pixels, and a non-display area adjacent to the display area; and
   a cover substrate including a plurality of dummy patterns, the cover substrate having a first area and a second area adjacent to the first area, wherein the plurality of dummy patterns is disposed on the second area and do not sense signals,
   wherein the first area overlaps the transparent display panel and the second area does not overlap with the transparent display panel,
   wherein the plurality of dummy patterns do not overlap any portion of the first substrate and the second substrate, and
   wherein the plurality of the dummy patterns is encapsulated by a color correction layer.

2. The transparent display apparatus of claim 1, wherein each of the plurality of dummy patterns included in the cover substrate has a substantially same shape as a shape of each of the plurality of pixels included in the transparent display panel.

3. The transparent display apparatus of claim 1, wherein each of the plurality of dummy patterns comprises:
   a first transmissive area transmitting light incident thereon; and
   a first non-transmissive area through which at least a part of the incident light does not pass.

4. The transparent display apparatus of claim 3, wherein each of the plurality of dummy patterns comprises a light blocking pattern provided in the first non-transmissive area,
   wherein the light blocking pattern comprises a light-absorbing material.

5. The transparent display apparatus of claim 3,
   wherein the color correction layer comprises a material reflecting light of a wavelength of a certain color.

6. The transparent display apparatus of claim 5, wherein the color correction layer provides the first transmissive area of each of the plurality of dummy patterns to have a color sense range of an image displayed by the transparent display panel.

7. The transparent display apparatus of claim 3, wherein each of the plurality of pixels comprises:
   a second transmissive area transmitting light incident thereon; and
   a second non-transmissive area through which at least a part of the incident light does not pass, and
   the second non-transmissive area comprises:
      an emission area emitting light and including a light emitting device having a first electrode, a light emitting layer, and a second electrode; and
      a line area including a plurality of lines connected to the light emitting device.

8. The transparent display apparatus of claim 7, wherein the first transmissive area of each of the plurality of dummy patterns has a substantially same shape as a shape of the second transmissive area of each of the plurality of pixels.

9. The transparent display apparatus of claim 8, wherein the first transmissive area of each of the plurality of dummy patterns has a substantially same size as a size of the second transmissive area of each of the plurality of pixels.

10. The transparent display apparatus of claim 7, wherein the first non-transmissive area of each of the plurality of dummy patterns has a substantially same shape as a shape of the second non-transmissive area of each of the plurality of pixels.

11. The transparent display apparatus of claim 10, wherein the first non-transmissive area of each of the plurality of dummy patterns has a substantially same size as a size of the second non-transmissive area of each of the plurality of pixels.

12. The transparent display apparatus of claim 7, wherein the plurality of lines comprise a driving voltage line transferring a first voltage to the first electrode of the light emitting device, and a common voltage line transferring a second voltage to the second electrode of the light emitting device.

13. The transparent display apparatus of claim 1, wherein a transmittance difference between the transparent display panel and the cover substrate in the second area is about 5% or less.

14. The transparent display apparatus of claim 1, wherein:
the second area comprises a first division area surrounding the first area and a second division area surrounding the first division area; and
a first dummy pattern is provided in the first division area of the cover substrate, and a second dummy pattern is provided in the second division area of the cover substrate.

15. The transparent display apparatus of claim 14, wherein the number of first dummy patterns per unit area is greater than the number of second dummy patterns per unit area.

16. The transparent display apparatus of claim 14, wherein a transmittance of the second division area of the cover substrate is higher than a transmittance of the first division area of the cover substrate.

17. The transparent display apparatus of claim 14, wherein a size of the first dummy pattern is greater than a size of the second dummy pattern.

18. The transparent display apparatus of claim 1, wherein:
the non-display area comprises a first side area, a second side area, a third side area, and a fourth side area, the first side area being provided at a first outer portion of the display area, the second side area facing the first side area, the third side area facing the fourth side area, and the third side area and the fourth side area being provided adjacent to the first side area and the second side area to connect the first side area to the second side area; and the transparent display panel comprises:
a first common voltage line provided in the first side area; and
a second common voltage line connected to the first common voltage line at one side thereof, the second common voltage line extending from the one side to the display area and transferring a voltage to the plurality of pixels.

19. The transparent display apparatus of claim 18, wherein:
the transparent display panel comprises a gate driver provided in at least one of the third side area and the fourth side area, the gate driver including a plurality of transistors; and
a difference between a transmittance of the transparent display panel in an area including the gate driver and a transmittance of the transparent display panel in the display area is about 5% or less.

20. A transparent display apparatus, comprising:
a transparent display panel including a first substrate, a second substrate, and a plurality of pixels provided between the first substrate and the second substrate, the transparent display panel having a display area including the plurality of pixels, and a non-display area adjacent to the display area; and
a cover substrate including a plurality of dummy patterns, the cover substrate having a first area and a second area adjacent to the first area, wherein the plurality of dummy patterns is disposed on the second area and do not sense signals,
wherein the first area overlaps the transparent display panel and the second area does not overlap with the transparent display panel,
wherein the plurality of dummy patterns do not overlap any portion of the first substrate and the second substrate, and
wherein each of the plurality of dummy patterns includes at least two light blocking patterns and the at least two light blocking patterns are spaced apart from each other and have a portion of a color correction layer positioned between them.

21. The transparent display apparatus of claim 20, wherein a portion of the color correction layer is adjacent each of the light blocking patterns, and
wherein the color correction layer directly contacts the cover substrate.

22. The transparent display apparatus of claim 20, wherein the at least two blocking patterns directly contact the cover substrate.

* * * * *